US012684948B2

(12) United States Patent
Huang et al.

(10) Patent No.: US 12,684,948 B2
(45) Date of Patent: Jul. 14, 2026

(54) DISPLAY PANEL, MANUFACTURING METHOD THEREOF, AND DISPLAY APPARATUS

(71) Applicants:Chengdu BOE Optoelectronics Technology Co., Ltd., Chengdu (CN); BOE Technology Group Co., Ltd., Beijing (CN)

(72) Inventors: Yao Huang, Beijing (CN); Yue Long, Beijing (CN); Weiyun Huang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 518 days.

(21) Appl. No.: 18/037,878

(22) PCT Filed: Nov. 20, 2020

(86) PCT No.: PCT/CN2020/130434
§ 371 (c)(1),
(2) Date: May 19, 2023

(87) PCT Pub. No.: WO2022/104702
PCT Pub. Date: May 27, 2022

(65) Prior Publication Data
US 2024/0016010 A1 Jan. 11, 2024

(51) Int. Cl.
*H10K 59/121* (2023.01)
*H10K 59/12* (2023.01)
(Continued)

(52) U.S. Cl.
CPC ....... *H10K 59/121* (2023.02); *H10K 59/1201* (2023.02); *H10K 59/122* (2023.02);
(Continued)

(58) Field of Classification Search
None
See application file for complete search history.

(56) References Cited

U.S. PATENT DOCUMENTS

| | | |
|---|---|---|
| 2015/0311269 A1 | 10/2015 | Hsu et al. |
| 2019/0198589 A1 | 6/2019 | Choi et al. |

(Continued)

FOREIGN PATENT DOCUMENTS

| | | |
|---|---|---|
| CN | 110010621 A | 7/2019 |
| CN | 110048005 A | 7/2019 |

(Continued)

OTHER PUBLICATIONS

CN 2020800029075 first office action.
(Continued)

*Primary Examiner* — Michelle Mandala
(74) *Attorney, Agent, or Firm* — IPro, PLLC

(57) ABSTRACT

The present disclosure provides a display panel, a manufacturing method thereof, and a display apparatus. The display panel has a display region comprising a first display region and a second display region. A distribution density of pixel circuits in the first display region is smaller than that in the second display region. The display panel includes: a base substrate; a plurality of first pixel circuits disposed on a side of the base substrate and located in the second display region; traces disposed on a side of the first pixel circuits away from the base substrate; first light emitting devices disposed on a side of the traces away from the base substrate and located in the first display region, where first anodes in the first light emitting devices each include at least two conductive layers, and the at least two conductive layers include at least a first transparent electrode; connecting lines each disposed on a same layer as first transparent electrodes and electrically connected with a respective one of the first transparent electrodes, where the traces are used to electri- (Continued)

cally connect the respective first pixel circuits and the respective connecting lines, so that the first pixel circuits drive the first light emitting devices to emit light.

16 Claims, 8 Drawing Sheets

(51) Int. Cl.

| | | |
|---|---|---|
| *H10K 59/122* | (2023.01) | |
| *H10K 59/131* | (2023.01) | |
| *H10K 71/00* | (2023.01) | |
| *H10K 71/20* | (2023.01) | |
| *H10K 71/60* | (2023.01) | |
| *H10K 59/80* | (2023.01) | |

(52) U.S. Cl.
CPC ......... *H10K 59/131* (2023.02); *H10K 71/233* (2023.02); *H10K 71/60* (2023.02); *H10K 71/621* (2023.02); *H10K 59/80517* (2023.02)

(56) References Cited

U.S. PATENT DOCUMENTS

| | | | |
|---|---|---|---|
| 2020/0303479 A1* | 9/2020 | Kim | H10K 59/1216 |
| 2021/0036078 A1 | 2/2021 | Sun et al. | |
| 2021/0208633 A1* | 7/2021 | Ma | H10K 59/131 |
| 2022/0157898 A1 | 5/2022 | Lou et al. | |
| 2022/0190055 A1 | 6/2022 | Lou et al. | |

FOREIGN PATENT DOCUMENTS

| | | |
|---|---|---|
| CN | 110112200 A | 8/2019 |
| CN | 110288945 A | 9/2019 |
| CN | 110299397 A | 10/2019 |
| CN | 110767702 A | 2/2020 |
| CN | 110854296 A | 2/2020 |
| CN | 210136876 U | 3/2020 |
| CN | 111180494 A | 5/2020 |
| CN | 111192902 A | 5/2020 |
| CN | 111341936 A | 6/2020 |
| CN | 111725287 A | 9/2020 |
| JP | 2012022784 A | 2/2012 |
| JP | 2019102147 A | 6/2019 |
| KR | 20090130560 A | 12/2009 |

OTHER PUBLICATIONS

CN 2020800029075 second office action.
CN 2020800029075 Notification of Rectification 1.
CN 2020800029075 Notification of Rectification 2.
PCT/CN2020/130434 international search report.
PCT/CN2020/130434 Written Opinion.
JP2023-524422 second office action dated Jan. 21, 2025.
JP2023-524422 first office action dated Sep. 30, 2024.

* cited by examiner

Second display region b ⟵--------⟶ First display region a

Second display region b ⋮ First display region a

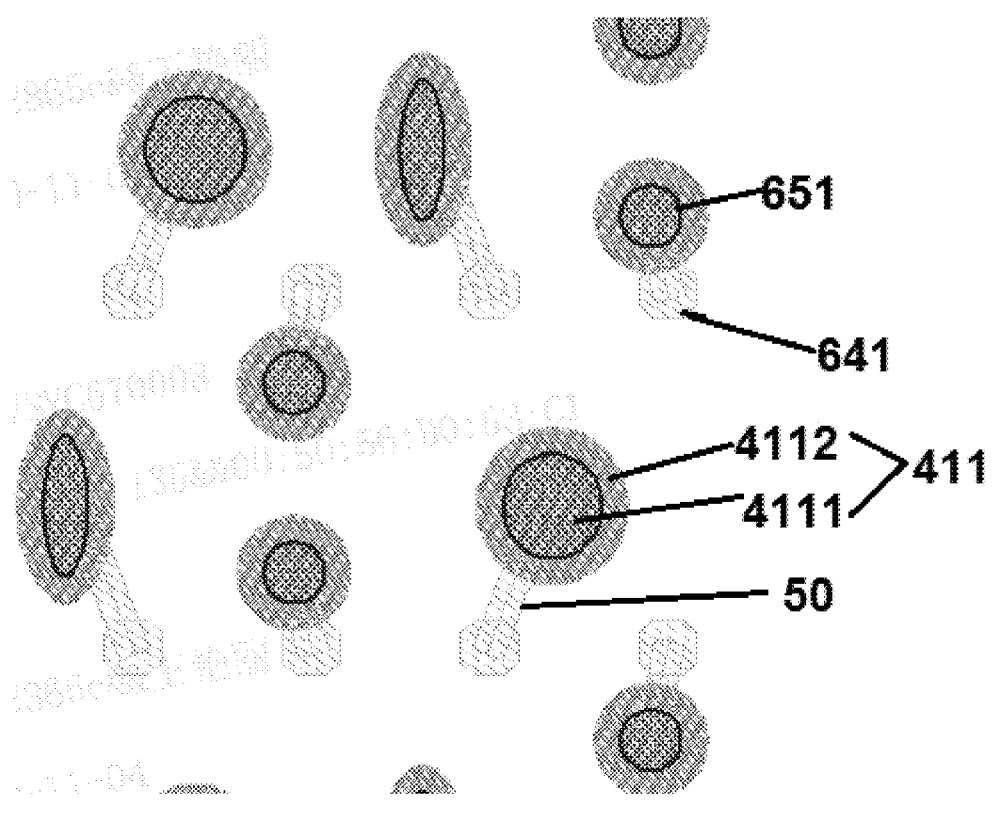
FIG. 5
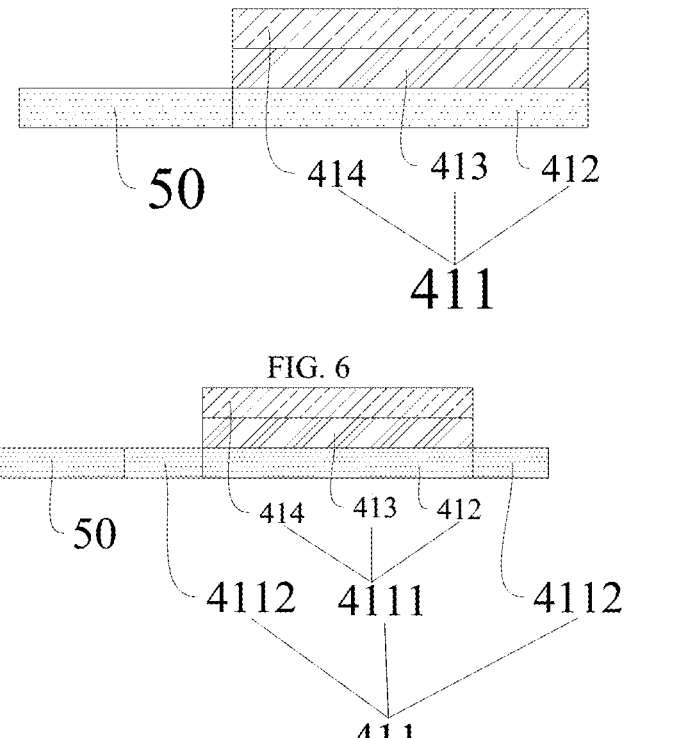
FIG. 6
FIG. 7

DISPLAY PANEL, MANUFACTURING METHOD THEREOF, AND DISPLAY APPARATUS

CROSS-REFERENCE TO RELATED APPLICATIONS

This application is a national stage of international PCT Application No. PCT/CN2020/130434, filed on Nov. 20, 2020, the entire contents of which are incorporated herein by reference.

TECHNICAL FIELD

The present disclosure relates to the field of display technologies, and in particular to a display panel, a manufacturing method thereof, and a display apparatus.

BACKGROUND

Currently, in order to increase the transmittance rate in the high-transmittance display region corresponding to the under-screen camera and to ensure the shooting performance of the under-screen camera, only the light emitting devices are retained in the high-transmittance display region, while the signals controlling the light-emitting devices to emit light are transmitted by the pixel circuit in the non-high-transmittance display region. However, picture quality of under-screen camera is still relatively poor at present.

Therefore, research into display panels with under-screen camera is yet to be further developed.

SUMMARY

The present disclosure is intended to solve, at least to some extent, one of the technical problems in the related art. To this end, an object of the present disclosure is to provide a display panel which has a first display region with a high transmittance rate to improve the quality of under-screen camera shots.

On one aspect of the present disclosure, a display panel is provided in the present disclosure. According to embodiments of the present disclosure, the display panel has a display region comprising a first display region and a second display region. A density of pixel circuits in the first display region is smaller than that in the second display region. The display panel includes: a base substrate; a plurality of first pixel circuits disposed on a side of the base substrate and located in the second display region; traces disposed on a side of the first pixel circuits away from the base substrate; first light emitting devices disposed on a side of the traces away from the base substrate and located in the first display region, where in a direction away from the base substrate, effective light emitting anode regions of first anodes in the first light emitting devices each include at least two conductive layers, and the at least two conductive layers include a first transparent electrode; connecting lines each disposed on a same layer as first transparent electrodes and electrically connected with a respective one of the first transparent electrodes, where the traces are used to electrically connect the respective first pixel circuits and the respective connecting lines, so that the first pixel circuits drive the first light emitting devices to emit light. As a result, according to the embodiments of the present disclosure, the connecting line is led out by the first transparent electrode in the first anode and electrically connected with the trace, so as to achieve the electrical connection between the first pixel circuit and the first light emitting device. Therefore, there is no need to dispose a protruding portion for electrically connecting with the trace on the first anode, thereby further improving the transmittance rate of the first display region.

According to the embodiments of the present disclosure, the traces are electrically connected with the connecting lines through first via holes, and the first via holes are located in the first display region.

According to the embodiments of the present disclosure, in the direction away from the base substrate, the first anodes each includes the first transparent electrode, a silver electrode, and a second transparent electrode that are sequentially stacked, and the connecting lines each are integrally formed with the respective one of the first transparent electrodes.

According to the embodiments of the present disclosure, a first insulating layer disposed on the side of the first pixel circuits away from the base substrate, and having second via holes penetrating the first insulating layer, where the traces are located on a side of the first insulating layer away from the base substrate, and the traces are electrically connected with the respective first pixel circuits through the respective second via holes; a second insulating layer disposed on the side of the first insulating layer away from the base substrate, covering the traces, and having the first via holes penetrating the second insulating layer, where the connecting lines are disposed on a side of the second insulating layer away from the base substrate.

According to the embodiments of the present disclosure, the first via holes are arranged in rows, and the traces are located between two adjacent rows of the first via holes.

According to the embodiments of the present disclosure, the first anodes each include an effective light emitting anode region and a non-light emitting anode region surrounding the effective light emitting anode region, an orthographic projection of the effective light emitting anode region on the base substrate is greater than or equal to an orthographic projection of an opening defined by a pixel defining layer in the first light emitting devices overlapping on the base substrate, and the non-light emitting anode region is covered by the pixel defining layer, where the non-light emitting anode region only includes the first transparent electrode.

According to the embodiments of the present disclosure, the display region further includes an under-screen functional region, which overlaps with the first display region.

According to the embodiments of the present disclosure, the display panel further includes a plurality of second pixel circuits and a plurality of second light emitting devices that are both located in the second display region, where the second pixel circuits are connected with respective second anodes in the second light emitting devices by at least one of following means: the second pixel circuits are electrically connected with the respective second anodes in the second light emitting devices directly through third via holes, to drive the second light emitting devices to emit light; the display panel further includes a conductive layer, which is disposed in a same layer as the traces, the second anodes are electrically connected with the conductive layer through fourth via holes that penetrate the second insulating layer, and the conductive layer is electrically connected with the second pixel circuits through fifth via holes that penetrate the first insulating layer, to drive the second light emitting devices to emit light.

On another aspect of the present disclosure, a method for manufacturing the above display panel is provided in the present disclosure. According to some embodiments of the present disclosure, the display region of the display panel includes the first display region and the second display region, and the density of pixel circuits in the first display region is less than the density of pixel circuits in the second display region; the method for manufacturing the display panel includes: forming the plurality of first pixel circuits on a side of the base substrate, and the first pixel circuits being located in the second display region; forming the traces on the side of the first pixel circuits away from the base substrate, and the traces being electrically connected with the respective first pixel circuits; forming first light emitting devices and connecting lines on a side of the traces away from the base substrate, where the first light emitting devices are located in the first display region, in the direction away from the base substrate, the effective light emitting anode regions of the first anodes in the first light emitting devices each include at least two conductive layers, at least one of the at least two conductive layers includes a first transparent electrode, and the connecting lines each are electrically connected with the respective first transparent electrodes and formed through a same step as the first transparent electrodes, The traces are used to electrically connect with the respective connecting lines, so that the first pixel circuits drive the first light emitting devices to emit light. As a result, according to the embodiments of the present disclosure, the connecting line is led out by the first transparent electrode in the first anode and electrically connected with the trace, so as to achieve the electrical connection between the first pixel circuit and the first light emitting device. Therefore, there is no need to dispose a protruding portion for electrically connecting with the trace on the first anode, thereby further improving the transmittance rate of the first display region.

According to the embodiments of the present disclosure, the method for manufacturing the display panel further includes: depositing a first insulating material layer on the side of the first pixel circuits away from the base substrate, and forming second via holes that penetrate the first insulating material layer in the first insulating material layer, to form a first insulating layer having the second via holes; depositing a second insulating material layer on the side of the first insulating layer away from the base substrate, and forming first via holes that penetrate the second insulating material layer in the second insulating material layer, to form a second insulating layer having the first via holes; the traces are located between the first insulating layer and the second insulating layer, and are electrically connected with the respective first pixel circuits through the second via holes; the connecting lines are disposed on a side of the second insulating layer away from the base substrate, and are electrically connected with the respective traces through the respective first via holes.

According to the embodiments of the present disclosure, steps of forming the first anodes and the connecting lines includes: sequentially forming a first transparent conductive layer, a silver layer, and a second transparent conductive layer on a surface of the second insulating layer away from the base substrate by deposition; coating a first photoresist and a second photoresist in a first region and a second region that are on a surface of the second transparent conductive layer, respectively, and a thickness of the first photoresist is greater than a thickness of the second photoresist; removing the first transparent conductive layer, the silver layer, and the second transparent conductive layer that are not covered by the first photoresist and the second photoresist; ashing on the first photoresist and the second photoresist to remove the second photoresist and thin the first photoresist; by an etching process, removing the first transparent conductive layer and the silver layer in the second region, and retaining the second transparent conductive layer to obtain the connecting lines; removing a thinned first photoresist to obtain the first anodes.

On yet another aspect of the present disclosure, a display apparatus is provided in the present disclosure. According to the embodiments of the present disclosure, the display apparatus includes: the display panel as described above, where the display region of the display panel includes a first display region and a second display region; an under-screen functional layer, where an orthographic projection of the under-screen functional layer on the display panel overlaps the first display region. Therefore, the display apparatus may meet requirements of large amount of incident light for the under-screen functional layer. In a case where the under-screen functional layer is the under-screen camera, the under-screen camera has a better amount of incident light, thereby ensuring its high shooting quality. A person skilled in the art may understand that the display apparatus has all features and advantages of the display panel described above, and this will not be further elaborated herein.

BRIEF DESCRIPTION OF THE DRAWINGS

FIG. 5 is a schematic diagram of a structure of first anodes and connecting lines in an embodiment of the present disclosure;

FIG. 6 is a schematic diagram of a structure of a first anode and a connecting line in an embodiment of the present disclosure;

FIG. 7 is a schematic diagram of another structure of a first anode and a connecting line in an embodiment of the present disclosure;

DETAILED DESCRIPTION OF THE EMBODIMENTS

The following describes in detail embodiments of the present disclosure. The embodiments described below are exemplary and are intended to explain the present disclosure rather than limit the scope of the present disclosure. If no specific technology or condition is specified in the embodiments, the technologies or conditions described in the literature in the field or the product manual shall be adopted.

Figure 1:
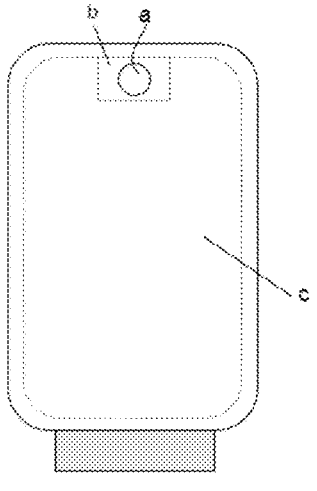
FIG. 1 is a schematic plan view of a display panel in an embodiment of the present disclosure.

In one aspect of the present disclosure, a display panel is provided in the present disclosure. According to some embodiments of the present disclosure, as shown in FIG. 1, the display region of the display panel includes a first display region a and a second display region b. In some embodiments, the second display region b is located at an outer edge of the first display region a, which means that the second display region b is disposed at an outer side of the first display region a, or the second display region b is disposed around a periphery of the first display region a. In addition, there is no special requirement for the specific setting position of the first display region a, and a person skilled in the art may flexibly choose it according to the actual design requirements of the under-screen functional region. For example, the second display region b may be located in a center of the display panel, or in a corner of the display panel, or as shown in FIG. 1, the second display region b may be located near a border of the display panel and centered.

Moreover, there is no specific requirement for a shape of the first display region a, and a person skilled in the art may flexibly choose it according to the actual situation. For example, the shape of the first display region a includes but is not limited to a circle, an ellipse, a polygon such as a quadrilateral, a pentagon, a hexagon, or an irregular shape.

Density of pixel circuits in the first display region is less than density of pixel circuits in the second display region, which means that distribution density of the pixel circuits in the first display region is less than distribution density of the pixel circuits (i.e., first pixel circuits referred to in the following text) in the second display region. It will be noted that the pixel circuits referred to in the text refer to the driving circuits that provide drive voltage for OLED emitting devices, and may be of circuit structures such as 7T1C or 9T2C.

In addition, as shown in FIG. 1, the display region of the display panel further includes a third display region c, which is located on a side of the second display region b away from the first display region a. The density of the pixel circuits in the third display region is greater than the density of the pixel circuits in the second display region. In some embodiments, the density of the pixel circuits in the first display region may be 0, i.e., pixel circuits may not be disposed in the first display region, and first emitting devices located in the first display region are all driven by the first pixel circuits in the second display region.

In addition, the distribution density of the emitting devices in the first display region a may be less than or equal to the distribution density of the emitting devices in the second display region b, and the distribution density of the emitting devices in the second display region b may be less than or equal to the distribution density of the emitting devices in the third display region c. Based on the above structure, the distribution density of the pixel circuits in the first display region a is the smallest, and it is ensured that sufficient light passes through the first display region and reach a back of the display panel. Meanwhile, by providing drive voltage for the emitting devices in the first display region a through the first pixel circuits in the second display region b, the display resolution (PPI) of the first display region a can be equal to or slightly lower than the display resolution of other regions.

It will be noted that the pixel circuit is used to drive the emitting device (OLED device) to emit light, and includes structures such as an active layer, a gate, source-drain, a storage capacitor, a data line, and a scan line.

Figures 2A, 2B, 2C:
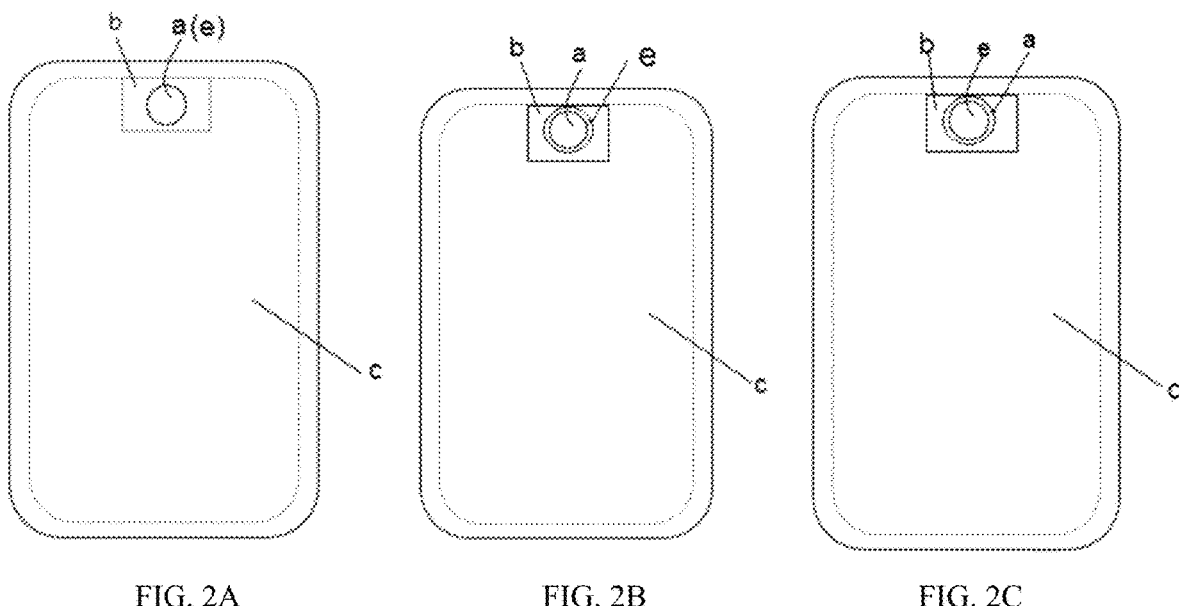
FIG. 2A is a schematic plan view of another display panel in an embodiment of the present disclosure.
FIG. 2B is a schematic plan view of yet another display panel in an embodiment of the present disclosure.
FIG. 2C is a schematic plan view of yet another display panel in an embodiment of the present disclosure.

According to the embodiments of the present disclosure, as shown in FIGS. 2A to 2C, the display region further includes an under-screen functional region e, which overlaps with the first display region a. In some specific embodiments, as shown in FIG. 2A, the first display region a coincides with the under-screen functional region e; in other embodiments, as shown in FIG. 2B, the first display region a is covered by the under-screen functional region e; in yet other embodiments, as shown in FIG. 2C, the under-screen functional region e is covered by the first display region a. The under-screen functional region refers to a region where the under-screen functional layer is disposed, and a part of the back of the display panel corresponding to the under-screen functional region is used to dispose the under-screen functional layer (e.g., an under-screen camera). The first display region has a high transmittance rate, which may meet the requirement of the amount of incident light for the under-screen camera, while greatly improving the screen-to-body ratio of the display panel.

Figure 8:
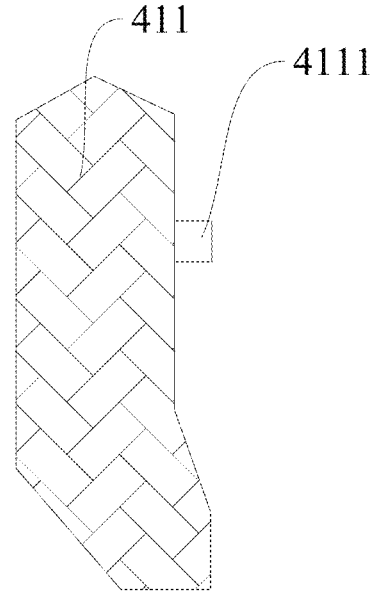
FIG. 8 is a schematic diagram of a structure of a first anode in the related art.

According to the embodiments of the present disclosure, referring to FIGS. 3, 4, 5 and 6, a display panel includes: a base substrate 10; a plurality of first pixel circuits 21 disposed on a side of the base substrate 10 and located in the second display region b; traces 30 disposed on a side of the first pixel circuits 21 away from the base substrate 10; first light emitting devices 41 disposed on a side of the traces 30 away from the base substrate 10 and located in the first display region a, where in a direction away from the base substrate 10, an effective light emitting anode region of a first anode 411 in the first light emitting device 41 includes at least two conductive layers, and the at least two conductive layers include a first transparent electrode 412 (e.g., as shown in FIG. 6, the first transparent electrode 412, a silver electrode 413, and a second transparent electrode 414 of the first anode 411 that are sequentially stacked); connecting lines 50 disposed on a same layer as the first transparent electrode 412 and electrically connected with the first transparent electrode 412, where the trace 30 is used for electrically connecting the first pixel circuit 21 and the connecting line 50, so that the first pixel circuit 21 drives the first light emitting device 41 to emit light. As a result, the connecting line 50 is led out by the first transparent electrode 412 in the first anode 411 and electrically connected to the trace 30, so as to achieve the electrical connection between the first pixel circuit 21 and the first light emitting device 41. Therefore, there is no need to dispose a protruding portion 4111 (as shown in FIG. 8, the protruding portion 4111 having a same structure as the first anode, i.e., a three-layer structure of the first transparent electrode, a silver electrode, and a second transparent electrode) for electrically connecting with the trace on the first anode 411, thereby further improving the transmittance rate of the first display region. Moreover, when the display region has the under-screen functional region, the back of the display panel corresponding to the under-screen functional region is used to dispose the under-screen camera. The inventors have found that if the first anode 411 is electrically connected with the trace through the protruding portion 4111, the protruding portion will cause severe glare and diffraction when taking pictures with the under-screen camera, thereby reducing its shooting performance. In this application, by providing a transparent connecting line electrically connected with the first anode, the glare and diffraction may be effectively alleviated, the shooting effect is greatly optimized and the shooting performance is improved.

The effective light emitting anode region mentioned above refers to a region of the first anode located inside an opening defined by the pixel defining layer.

Figure 4:
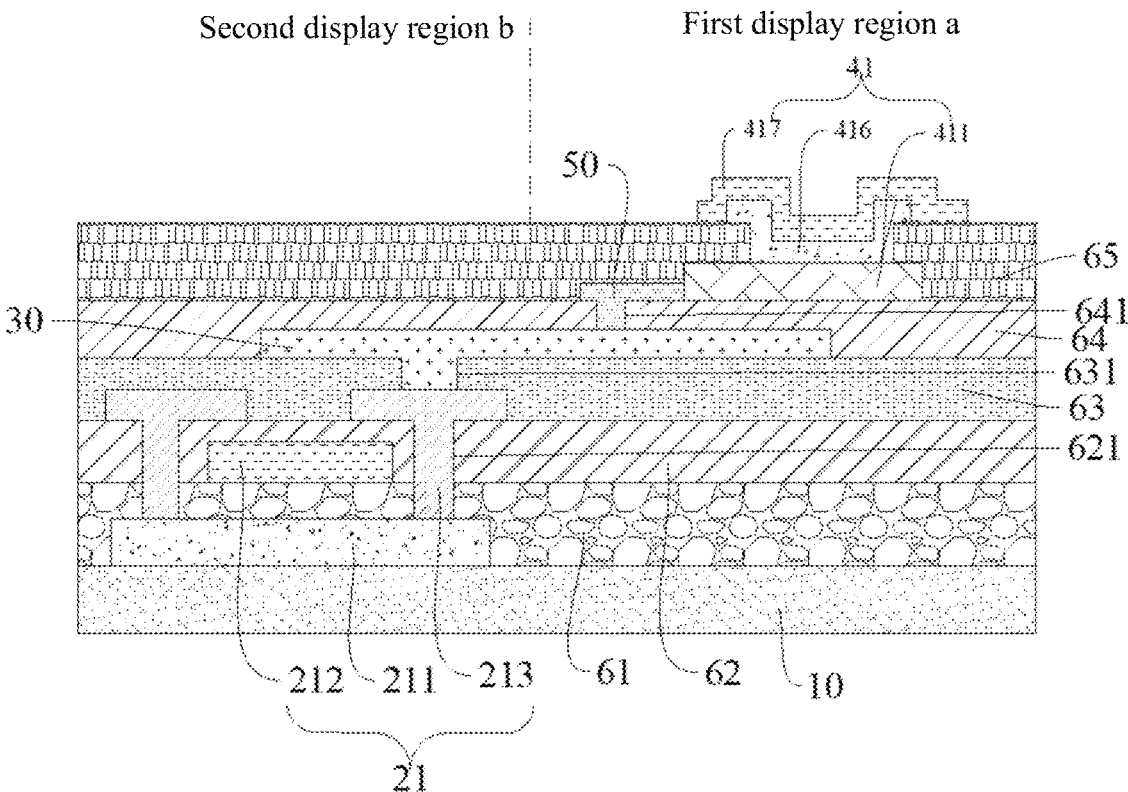
FIG. 4 is a schematic diagram of a structure of yet another display panel in an embodiment of the present disclosure.

There are no specific requirement for the specific structure of the first pixel circuit 21, and a person skilled in the art may flexibly choose it according to actual conditions. In some embodiments, the first pixel circuit 21 is a 7T1C circuit (i.e., seven transistors and one capacitor) structure, including a driving transistor, a data writing transistor, a storage capacitor, a threshold compensation transistor, a first reset transistor, a second reset transistor, a first light emitting control transistor, and a second light emitting control transistor. There are no special requirements for the vertical structure of the first pixel circuit 11. In some embodiments, as shown in FIG. 4, the first pixel circuit 21 includes structures such as an active layer 211, a gate 212, and a source-drain 213. The active layer 211 is disposed on a side of the base substrate 10, and a gate insulating layer 61 covers the active layer 211. The gate 212 is disposed on a surface of the gate insulating layer 61 away from the base substrate 10, and an interlayer dielectric layer 62 is disposed on a side of the gate insulating layer 61 away from the base substrate 10, covering the gate 212. The source-drain 213 is disposed on a side of the interlayer dielectric layer 62 away from the base substrate 10, the interlayer dielectric layer 62 has a via hole 621, and the source-drain 213 is electrically connected with the active layer through a via hole penetrating the gate insulating layer and the via hole 621 penetrating the interlayer dielectric layer. As shown in FIG. 4, the electrical connection between the trace 30 and the first pixel circuit 21 is achieved by connecting the trace 30 with the source-drain 213.

In addition, referring to FIG. 4, the first light emitting device 41 includes a light emitting layer 416 and a cathode 417 in addition to the first anode 411 as previously described. In some embodiments, the first light emitting device 41 may further include at least one of structures such as a hole transport layer, a hole injection layer, an electron transport layer and an electron injection layer, and a person skilled in the art may flexibly choose it according to actual design requirements.

According to the embodiments of the present disclosure, referring to FIGS. 4 and 5, the trace 30 and the connecting line 50 are electrically connected through a first via hole 641, which is located in the first display region. According to the embodiments of the present disclosure, referring to FIGS. 4 and 6, in the direction away from the base substrate 10, the first transparent electrode 412, the silver electrode 413, and the second transparent electrode 414 of the first anode 411 are sequentially stacked. The connecting line 50 is integrally formed with the first transparent electrode 412, that is, the connecting line 50 is disposed on a same layer as the first transparent electrode 412 and manufactured through a same step as the first transparent electrode 412. As a result, not only can the transmittance rate of the first display region be improved, but also adverse phenomena such as glare and diffraction generated when taking photos with an under-screen camera can be effectively alleviated.

Figure 11:
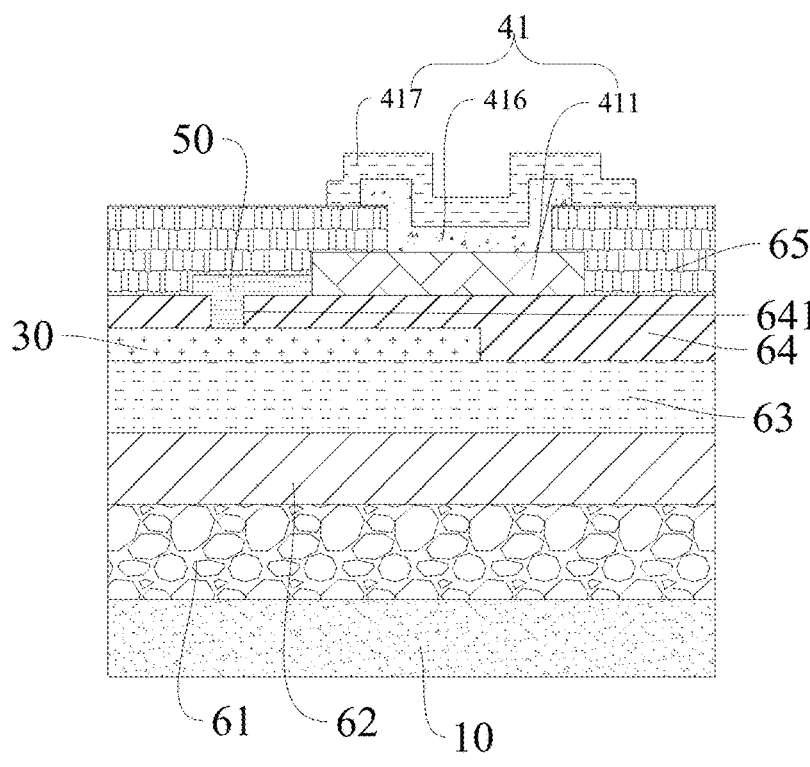
FIG. 11 is a schematic diagram of a structure of yet another display panel in an embodiment of the present disclosure.

In addition, referring to FIGS. 4 and 11, the display panel further includes a pixel defining layer 65, which is disposed on a surface of a second insulating layer 64 away from the base substrate, and defines a plurality of openings, where the first light emitting devices and the second light emitting devices are disposed in the openings.

According to the embodiments of the present disclosure, referring to FIG. 5, the first anode 411 includes the effective light emitting anode region 4111 and a non-light emitting anode region 4112 surrounding the effective light emitting anode region 4111. An orthographic projection of the effective light emitting anode region 4111 on the base substrate is greater than or equal to an orthographic projection of an opening 651 defined by the pixel defining layer 65 in the first light emitting device on the base substrate. The non-light emitting anode region 4112 is covered by the pixel defining layer. In some embodiments, a structure of the non-light emitting anode region also includes a first transparent electrode 412, a silver electrode 413, and a second transparent electrode 414 that are sequentially stacked, that is, the structure of the non-light emitting anode region is the same as the structure of the effective light emitting anode region 4111. In other embodiments, the non-light emitting anode region 4112 only includes the first transparent electrode 412. That is, during the manufacture process, when the silver electrode 413 and the second transparent electrode 414 on the connecting line are etched, the corresponding silver electrode 413 and the second transparent electrode 414 in the non-light emitting anode region 4112 are also removed, only the first transparent electrode 412 is remained. The schematic diagram of the structure can be referred to FIG. 7.

According to the embodiments of the present disclosure, there are no special requirements for materials of the connecting line, the first transparent electrode, the second transparent electrode, and the trace. A person skilled in the art can flexibly choose materials according to actual conditions. In some embodiments, the materials of the connecting line, the first transparent electrode, the second transparent electrode, and the trace are each independently made of transparent conductive materials such as ITO or IZO.

According to the embodiments of the present disclosure, referring to FIG. 4, the display panel further includes: a first insulating layer 63 disposed on a side of the first pixel circuit (in FIG. 4, the first insulating layer 63 being disposed on a side of the source-drain electrode 213 away from the base substrate 10) away from the base substrate 10, and having a second via hole 631 penetrating the first insulating layer 63, where the trace 30 is located on the side of the first insulating layer 63 away from the base substrate 10, and is electrically connected with the first pixel circuit 21 (with the source-drain electrode 213) through the second via hole 631; a second insulating layer 64 disposed on the side of the first insulating layer 63 away from the base substrate 10, covering the trace 30, and having the first via hole 641 penetrating the second insulating layer 64, where the connecting line 50 is disposed on a side of the second insulating layer 64 away from the base substrate 10, and is electrically connected with the trace 30 through the first via hole 641.

Figure 9:
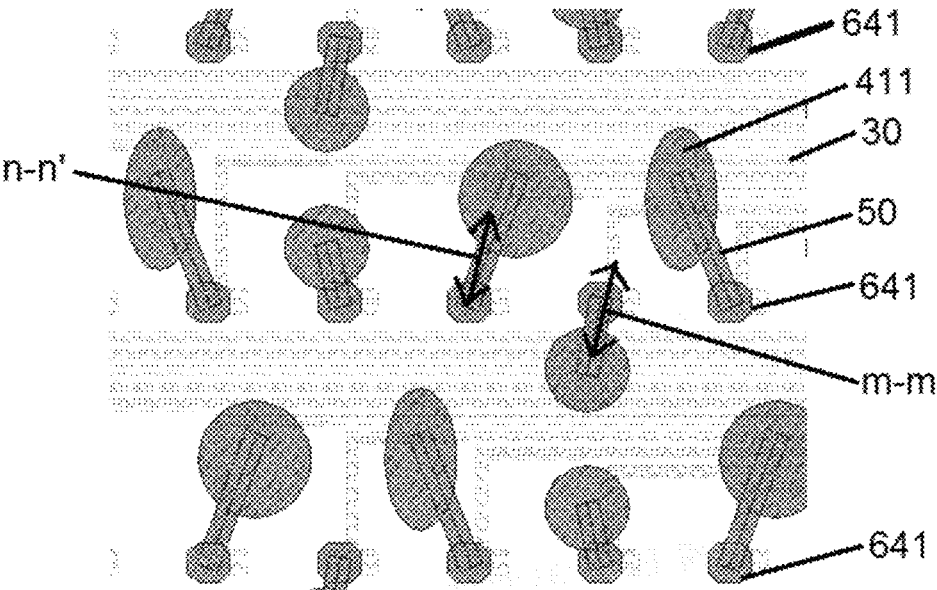
FIG. 9 is a schematic plan view of a part of a structure of yet another display panel in an embodiment of the present disclosure.
Figure 10:
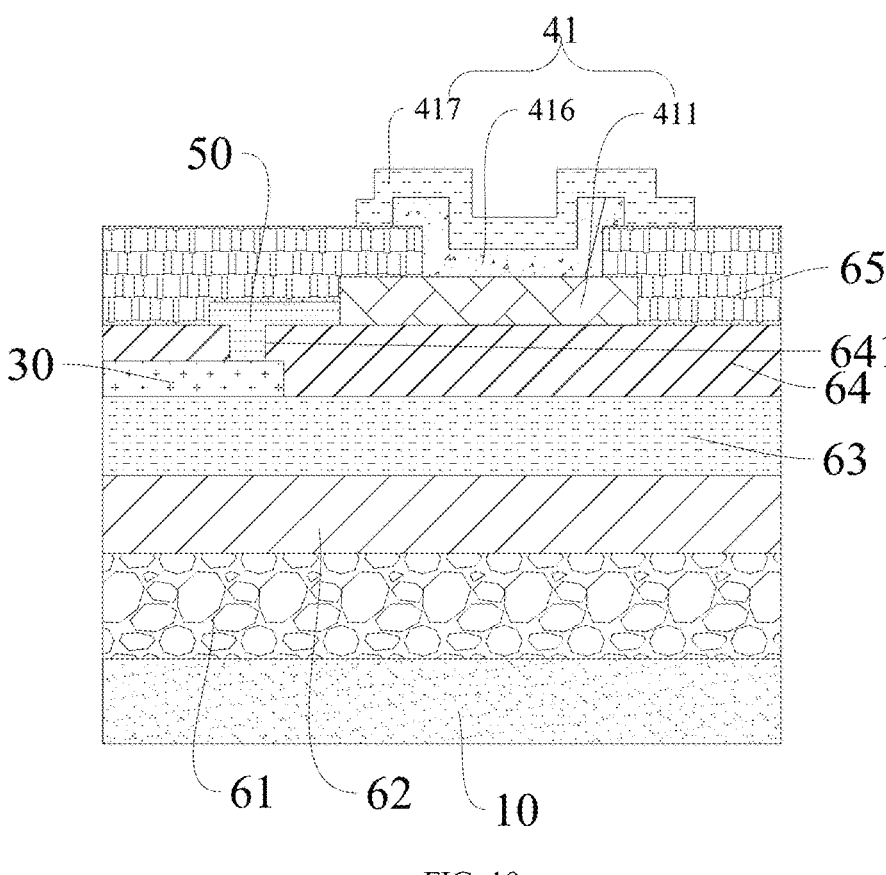
FIG. 10 is a schematic diagram of a structure of yet another display panel in an embodiment of the present disclosure.

According to the embodiments of the present disclosure, as shown in FIG. 9, a plurality of first via holes 641 are arranged in rows, and the trace 30 is located between adjacent rows of the first via holes 641. Therefore, it can be beneficial to arrange the layout of traces 30 reasonably and layout more traces 30 in a limited space. As shown in FIG. 9, it can be seen that there may or may not be an overlapping region between the first anode 411 and the trace 30 that is electrically connected with the first anode. Specifically, the sectional view along m-m' in FIG. 9 can refer to FIG. 10, there is no overlapping region between an orthographic projection of the first anode 411 on the base substrate and an orthographic projection of the trace 30 that is electrically connected with the first anode on the base substrate, that is, the trace 30 is electrically connected with the connecting line 50 through the first via hole 641 and then extends in a direction away from the first anode 411. A sectional view along n-n' in FIG. 9 can refer to FIG. 11, there is a partially overlapping region between the orthographic projection of the first anode 411 on the base substrate and the orthographic projection of the trace 30 that is electrically connected with the first anode on the base substrate, that is, the trace 30 is electrically connected with the connecting line 50 through the first via hole 641 and then extends in the direction towards the first anode 411.

Figure 3:
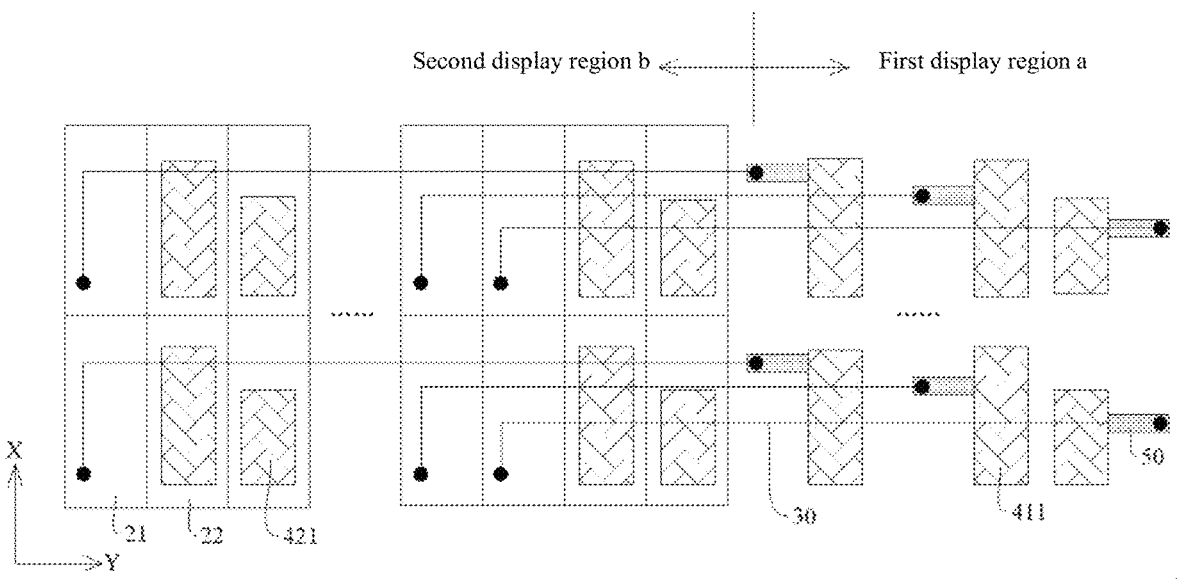
FIG. 3 is a schematic plan view of a structure of a part of yet another display panel in an embodiment of the present disclosure.
Figure 12:
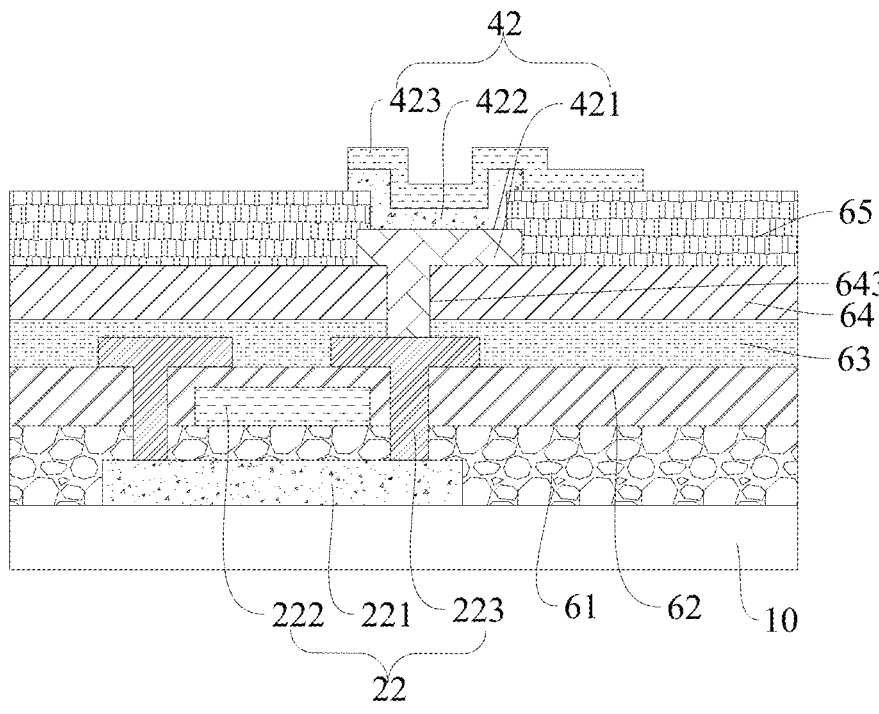
FIG. 12 is a schematic diagram of a structure of yet another display panel in an embodiment of the present disclosure.
Figure 13:
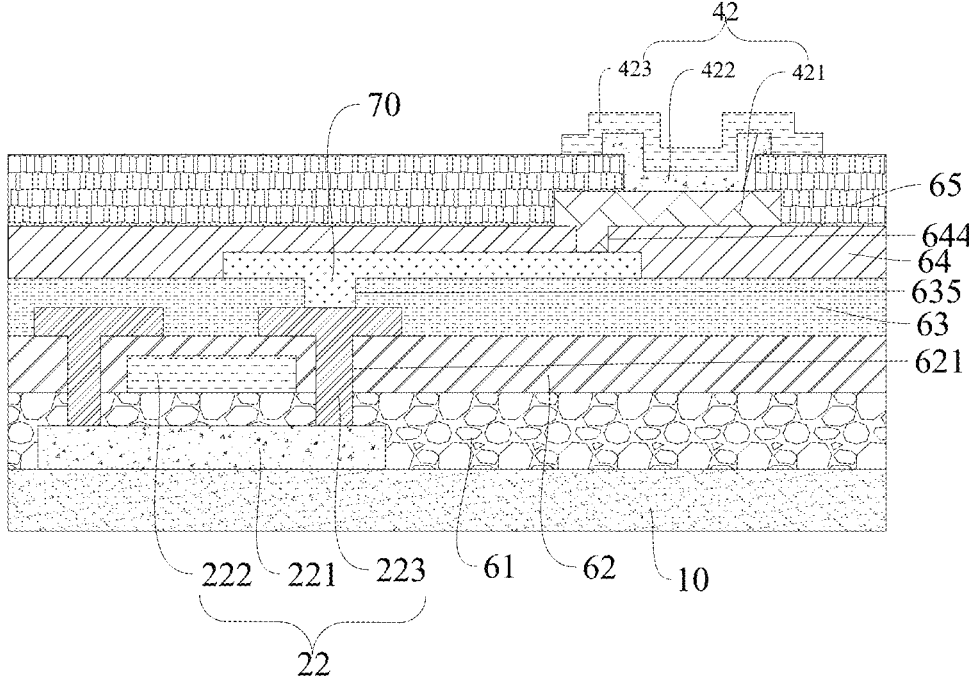
FIG. 13 is a schematic diagram of a structure of yet another display panel in an embodiment of the present disclosure.

According to the embodiments of the present disclosure, with reference to FIGS. 3, 12, and 13, the display panel further includes a plurality of second pixel circuits 22 and a plurality of second light emitting devices 42, and the second pixel circuits 22 and the second light emitting devices 42 are located in the second display region b. In some embodiments, as shown in FIG. 12, the second pixel circuit 22 is electrically connected with the second anode 421 directly in the second light emitting device 42 through a third via hole 643 that penetrates the first insulating layer 63 and the second insulating layer 64, to drive the second light emitting device to emit light. In other embodiments, as shown in FIG. 13, the display panel further includes a conductive layer 70, which is disposed in a same layer as the trace 30 (i.e., the conductive layer 70 being formed of a same material and during a same process as the trace 30). The second anode 421 is electrically connected with the second pixel circuit 22 through the conductive layer 70, that is, the second anode 421 is electrically connected with the conductive layer through a fourth via hole 644 that penetrates the second insulating layer 64, and the conductive layer 70 is electrically connected with the second pixel circuit through a fifth via hole 635 that penetrates the first insulating layer 63. And in turn, electrical connection between the second pixel circuit and the second anode is achieved, and the second pixel circuit drives the second light emitting device to emit light.

In addition, referring to FIGS. 12 and 13, the second light emitting device 42 includes a light emitting layer 422 and a cathode 423 in addition to the second anode 421 as previously described. In some embodiments, the second light emitting device 42 may further include at least one of structures such as a hole transport layer, a hole injection layer, an electron transport layer and an electron injection layer, and a person skilled in the art may flexibly choose it according to actual design requirements.

As shown in FIGS. 12 and 13, the second pixel circuit 22 includes structures such as an active layer 221, a gate 222, and a source-drain 223. The active layer 221 is disposed on a side of the base substrate 10, and a gate insulating layer 61 covers the active layer 221. The gate 222 is disposed on a surface of the gate insulating layer 61 away from the base substrate, and an interlayer dielectric layer 62 is disposed on a side of the gate insulating layer 61 away from the base substrate 10, covering the gate 222. The source-drain 223 is disposed on a side of the interlayer dielectric layer 62 away from the base substrate, and the source-drain 223 is electrically connected with the active layer through a via hole penetrating the gate insulating layer and the interlayer dielectric layer. As shown in FIGS. 12 and 13, the source-drain electrode 223 in the second pixel circuit is electrically connected with the second anode 421.

In some embodiments, as shown in FIG. 3, the first pixel circuits 21 and the second pixel circuits 22 are arranged in an array in a first direction X and a second direction Y. To ensure uniform brightness in the second display region, a plurality of first pixel circuits 21 and second pixel circuits 22 may be evenly dispersed. The specific arrangement of the pixel units may be flexibly adopted by a person skilled in the art based on the specific situation, and is not limited to any specific requirement.

According to the embodiments of the present disclosure, a shape of the first anode is identical to a shape of the second anode. Therefore, the first anode does not need to have a protruding portion, and the shape of the first anode can be kept consistent with the shape of the second anode. This not only ensures the light emitting efficiency of the first light emitting device, but also effectively guarantees a high transmittance rate in the first display region. A person skilled in the art will understand that shapes of anodes of light-emitting devices of different colors may be different. That is to say, shapes of anodes of a blue light emitting device, a red light emitting device, and a green light emitting device are different. Therefore, the "shape of the first anode is identical to the shape of the second anode" means that shapes of anodes of same color light-emitting devices in the first display region and the second display region are the same. That is, the shape of the first anode of the red light emitting device in the first display region is the same as the shape of the second anode of the red light emitting device in the second display region, the shape of the first anode of the blue light emitting device in the first display region is the same as the shape of the second anode of the blue light-emitting device in the second display region, and the shape of the first anode of the green light emitting device in the first display region is the same as the shape of the second anode of the green light-emitting device in the second display region.

It will be noted that due to various factors such as manufacture processes, it is difficult to make the shapes of the first anode and the second anode completely identical. Therefore, as long as the shapes of the first anode and the second anode are approximately the same, it can be considered that "the shape of the first anode is identical to the shape of the second anode".

Figure 14:
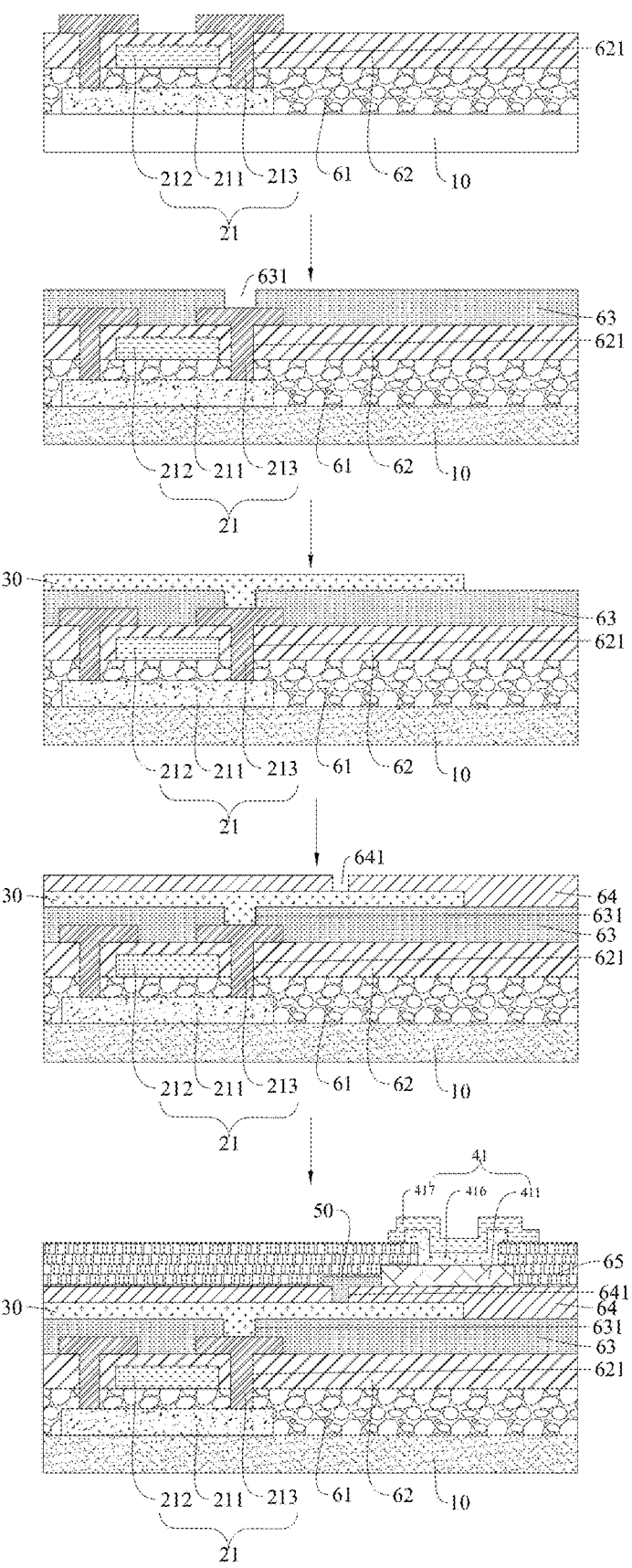
FIG. 14 is a schematic diagram of a structure for manufacturing a display panel in an embodiment of the present disclosure.

On another aspect of the present disclosure, a method for manufacturing the above display panel is provided in the present disclosure. According to some embodiments of the present disclosure, the display region of the display panel includes a first display region and a second display region, and a density of pixel circuits in the first display region is less than a density of pixel circuits in the second display region. Referring to FIG. 14, the method for manufacturing the above display panel, includes:

S100: a plurality of first pixel circuits 21 are formed on a side of the base substrate 10, and the first pixel circuits 21 are located in the second display region b.

There are no specific requirement for the specific structure of the first pixel circuit 21, and a person skilled in the art may flexibly choose it according to actual conditions. In some embodiments, the first pixel circuit 21 is a 7T1C circuit (i.e., seven transistors and one capacitor) structure, including a driving transistor, a data writing transistor, a storage capacitor, a threshold compensation transistor, a first reset transistor, a second reset transistor, a first light emitting control transistor, and a second light emitting control transistor. There are no special requirements for the vertical structure of the first pixel circuit 11. In some embodiments, as shown in FIG. 4, the first pixel circuit 21 includes structures such as an active layer 211, a gate 212, and a source-drain 213. The active layer 211 is disposed on a side of the base substrate 10, and a gate insulating layer 61 covers the active layer 211. The gate 212 is disposed on a surface of the gate insulating layer 61 away from the base substrate 10, and an interlayer dielectric layer 62 is disposed on a side of the gate insulating layer 61 away from the base substrate 10, covering the gate 212. The source-drain 213 is disposed on a side of the interlayer dielectric layer 62 away from the base substrate 10, and the source-drain 213 is electrically connected with the active layer through a via hole penetrating the gate insulating layer and the interlayer dielectric layer.

According to the embodiments of the present disclosure, a method for manufacturing the display panel further includes: forming second pixel circuits 22 in the second display region (as shown in FIGS. 3 and 12), and a person skilled in the art can understand that the second pixel circuits are formed simultaneously with the first pixel circuit. As shown in FIG. 8, the second pixel circuit 22 includes structures such as an active layer 221, a gate 222, and a source-drain 223. The active layer 221 is disposed on a side of the base substrate 10, and a gate insulating layer 61 covers the active layer 221. The gate 222 is disposed on a surface of the gate insulating layer 61 away from the base substrate 10, and an interlayer dielectric layer 62 is disposed on a side of the gate insulating layer 61 away from the base substrate, covering the gate 222. The source-drain 223 is disposed on a side of the interlayer dielectric layer 62 away from the base substrate, and the source-drain 223 is electrically connected with the active layer through a via hole penetrating the gate insulating layer and the interlayer dielectric layer.

In addition, as shown in FIG. 3, the first pixel circuits 21 and the second pixel circuits 22 are arranged in an array in the first direction X and the second direction Y. To ensure uniform brightness in the second display region, a plurality of first pixel circuits 21 and second pixel circuits 22 may be evenly dispersed. The specific arrangement of the pixel units may be flexibly adopted by a person skilled in the art based on the specific situation, and is not limited to any specific requirement.

S200: traces 30 are formed on the side of the first pixel circuits 21 away from the base substrate 10, and the traces 30 are electrically connected with the first pixel circuits 21. As shown in FIG. 13, the electrical connection between the trace 30 and the first pixel circuit 21 means electrical connection between the trace 30 and the source-drain 213.

As shown in FIG. 13, before the formation of the trace 30, a first insulating material layer is first deposited on the side of the first pixel circuit 21 away from the base substrate 10, and a second via hole 631 that penetrates the first insulating material layer is formed in the first insulating material layer, to form a first insulating layer 63 having the second via hole 631. The trace 30 is located on the side of the first insulating layer 63 away from the base substrate 10 and is electrically connected with the first pixel circuit 21 (electrically connected with the source-drain electrode layer 213) through the second via hole 631.

Furthermore, after the formation of the trace 30, the method further includes: depositing the second insulating material layer on the side of the first insulating layer 63 away from the base substrate 10, and forming the first via hole 641 that penetrates the second insulating material layer in the second insulating material layer, to form the second insulating layer 64 having the first via hole 641. That is, the trace 30 is located between the first insulating layer 63 and the second insulating layer 64. The subsequently formed connecting line 50 is located on the side of the second insulating layer 64 away from the base substrate 10, and is electrically connected with the trace 30 through the first via hole 641.

S300: forming the first light emitting devices 41 and the connecting lines 50 on the side of the traces 30 away from the base substrate. The first light emitting devices 41 are located in the first display region a. In the direction away from the base substrate 10, the effective light emitting anode region of the first anode 411 in the first light emitting device 41 includes at least two conductive layers. At least one of the at least two conductive layers includes a first transparent electrode 412 (in FIG. 13, the first anode 411 including the first transparent electrode 412, silver electrode 413, and second transparent electrode 414 that are sequentially stacked). The connecting line 50 is electrically connected with the first transparent electrode 412 and formed through the same step as the first transparent electrode 412. The trace 30 is electrically connected with the connecting line 50, so that the first pixel circuit 21 drives the first light emitting device 41 to emit light.

In some embodiments, as shown in FIG. 13, the first light emitting device 41 and the connecting line 50 are formed on the surface of the second insulating layer 64 away from the base substrate 10. The connecting line 50 is electrically connected with the trace 30 through the second via hole 641.

According to the embodiments of the present disclosure, the connecting line is led out by the first transparent electrode in the first anode and electrically connected with the trace, so as to achieve the electrical connection between the first pixel circuit and the first light emitting device. Therefore, there is no need to dispose a protruding portion for electrically connecting with the trace on the first anode, thereby further improving the transmittance rate of the first display region.

Figure 15:
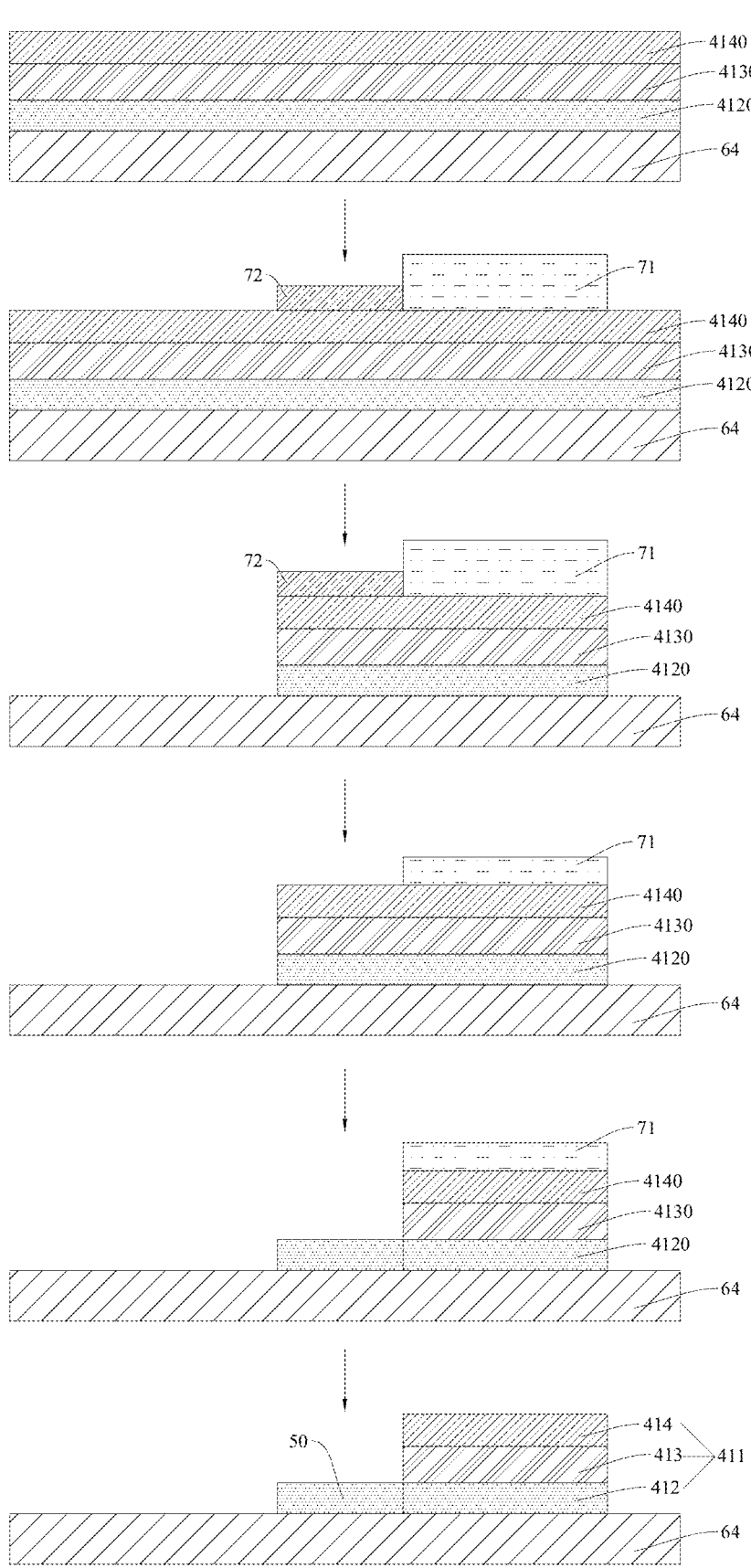
FIG. 15 is a schematic diagram of a structure for manufacturing a first anode and a connecting line in an embodiment of the present disclosure.

According to the embodiments of the present disclosure, as shown in FIG. 15, formation steps of the first anode 411 and the connecting line 50 include:

S310: deposition is performed sequentially on the surface of the second insulating layer 64 away from the base substrate 10 to form the first transparent conductive layer 4120, the silver layer 4130, and the second transparent conductive layer 4140.

S320: on the surface of the second transparent conductive layer 4140, the first photoresist 71 and the second photoresist 72 are respectively formed in the first region and the second region. A thickness of the first photoresist 71 is greater than a thickness of the second photoresist 72. A person skilled in the art can understand that, the above first region overlaps with an orthographic projection of a first anode to be formed on the surface of the second insulating layer 64, and the second region overlaps with an orthographic projection of a connecting line 50 to be formed on the surface of the second insulating layer 64.

In some specific embodiments, steps of forming the first photoresist 71 and the second photoresist 72 include: firstly forming a layer of photoresist with equal thickness on the surface of the second insulating layer 64, then using a halftone mask and gray-scale processing to remove a photoresist outside the first region and the second region, and thinning a photoresist at the second region, thereby obtaining the first photoresist 71 and the second photoresist 72.

S330: Removing the first transparent conductive layer 4120, the silver layer 4130, and the second transparent conductive layer 4140 that are not covered by the first photoresist 71 and the second photoresist 72. By the above steps, preliminary shapes of the first anode and the connecting line is obtained.

S340: Conducting a gray-scale processing on the first photoresist 71 and the second photoresist 72 to remove the second photoresist 72 and thin the first photoresist 71. In some embodiments, by the gray-scale processing, the second photoresist 72 may be removed, and the first photoresist 71 is thinned.

S350: by the etching process, removing the second transparent conductive layer 4140 and the silver layer 4130 at the second region, and retaining the first transparent conductive layer 4120 to obtain the connecting line 50.

In the above steps, by controlling the etching rate and etching time, the second transparent conductive layer 4140 and the silver layer 4130 at the second region may be removed, and the first transparent conductive layer 4120 is retained. A person skilled in the art may flexibly choose the specific etching rate and etching time according to the thickness, material, and other actual conditions of each layer structure, and this is not limited herein.

S360: Removing the thinned first photoresist 71 to obtain the first anode 411.

According to the embodiments of the present disclosure, the method for manufacturing the display panel further includes: referring to FIG. 13, forming the pixel defining layer 65 on the surface of the second insulating layer 64 away from the base substrate, forming the pixel defining layer 65 after forming the first anode and the connecting line, and the pixel defining layer 65 covering the connecting line 50 and a part of the first anode 411. The pixel defining layer 65 defines a plurality of openings, and the light emitting devices are disposed in the openings.

According to the embodiments of the present disclosure, with reference to FIGS. 3, 12, and 13, the method for manufacturing the display panel further includes: the step for manufacturing a plurality of second light emitting devices 42, and the second light emitting devices 42 are located in the second display region b. In some embodiments, as shown in FIG. 12, the second pixel circuit 22 is electrically connected with the second anode 421 in the second light emitting device 42 directly through a third via hole 643 that penetrates the first insulating layer 63 and the second insulating layer 64, to drive the second light emitting device to emit light. In other embodiments, as shown in FIG. 13, the display panel further includes a conductive layer 70, which is disposed in a same layer as the trace 30 (i.e., the conductive layer 70 is formed of a same material and during a same process as the trace 30). The second anode 421 is electrically connected with the second pixel circuit 22 through the conductive layer 70, that is, the second anode 421 is electrically connected with the conductive layer through a fourth via hole 644 that penetrates the second insulating layer 64, and the conductive layer 70 is electrically connected with the second pixel circuit through a fifth via hole 635 that penetrates the first insulating layer 63. And in turn, electrical connection between the second pixel circuit and the second anode is achieved, and the second pixel circuit drives the second light emitting device to emit light.

In addition, referring to FIGS. 12 and 13, the second light emitting device 42 includes a light emitting layer 422 and a cathode 423 in addition to the second anode 421 as previously described. In some embodiments, the second light emitting device 42 may further include at least one of structures such as a hole transport layer, a hole injection layer, an electron transport layer and an electron injection layer, and a person skilled in the art may flexibly choose it according to actual design requirements.

According to the embodiments of the present disclosure, referring to FIGS. 4 and 5, the trace 30 and the connecting line 50 are electrically connected through a first via hole 641, which is located in the first display region. According to the embodiments of the present disclosure, referring to FIGS. 4 and 6, in the direction away from the base substrate 10, the first transparent electrode 412, the silver electrode 413, and the second transparent electrode 414 of the first anode 411 are sequentially stacked. The connecting line 50 is integrally formed with the first transparent electrode 412, that is, the connecting line 50 is disposed on a same layer as the first transparent electrode 412 and manufactured through a same step as the first transparent electrode 412. As a result, not only can the transmittance rate of the first display region be improved, but also adverse phenomena such as glare and diffraction generated when taking photos with an under-screen camera can be effectively alleviated.

In addition, referring to FIGS. 4 and 12, the display panel further includes a pixel defining layer 65, which is disposed on a surface of a second insulating layer 64 away from the base substrate, and defines a plurality of openings, where the first light emitting device and the second light emitting device are disposed in the openings.

According to the embodiments of the present disclosure, referring to FIG. 5, the first anode 411 includes the effective light emitting anode region 4111 and a non-light emitting anode region 4112 surrounding the effective light emitting anode region 4111. An orthographic projection of the effective light emitting anode region 4111 on the base substrate is greater than or equal to an orthographic projection of an opening 651 defined by the pixel defining layer 65 in the first light emitting device on the base substrate. The non-light emitting anode region 4112 is covered by the pixel defining layer. In some embodiments, a structure of the non-light emitting anode region also includes a first transparent electrode 412, a silver electrode 413, and a second transparent electrode 414 that are sequentially stacked, that is, the structure of the non-light emitting anode region is the same as the structure of the effective light emitting anode region 4111. In other embodiments, the non-light emitting anode region 4112 only includes the first transparent electrode 412. That is, during the manufacture process, when the silver electrode 413 and the second transparent electrode 414 are etched away from the upper layer of the connecting line, the corresponding silver electrode 413 and the second transparent electrode 414 in the non-light emitting anode region 4112 are also removed, only the first transparent electrode 412 is remained. The schematic diagram of the structure can be referred to FIG. 7.

A person skilled in the art may understand that the second light emitting device and the first light emitting device are manufactured synchronously, that is, the first anode and the second anode in the second light emitting device are also manufactured synchronously.

On yet another aspect of the present disclosure, a display apparatus is provided in the present disclosure. According to the embodiments of the present disclosure, the display apparatus includes: the display panel as described above, where the display region of the display panel includes a first display region and a second display region; an under-screen functional layer, where there is an overlapping region between an orthographic projection of the under-screen functional layer on the display panel and the first display region, or in other words, the orthographic projection of the under-screen functional layer on the display panel overlaps with the under-screen functional region. Therefore, the display apparatus may meet requirements of large amount of incident light for the under-screen functional layer. In a case where the under-screen functional layer is the under-screen camera, the under-screen camera has a better amount of incident light, thereby ensuring its high shooting quality. A person skilled in the art may understand that the display apparatus has all features and advantages of the display panel described above, and this will not be further elaborated herein.

According to the embodiments of the present disclosure, there are no special requirements for specific types of the above display apparatus. A person skilled in the art may flexibly choose materials according to actual conditions. In some embodiments, the specific types of the display apparatus includes but are not limited to all display devices with display functions such as a mobile phone, a laptop, a Kindle, an iPad, a television, or a game console.

A person skilled in the art may understand that the display apparatus not only includes the display panel described above, but also includes required structures or components for conventional display devices. For example, in a mobile phone, in addition to the display panel described above, it also includes required structures or components such as a glass cover plate, a battery back cover, a middle frame, a main-board, a touch module, an audio module, or a camera module.

In the descriptions of the present specification, terms such as "an embodiment", "some embodiments", "an example", "a specific example" or "some examples" are intended to refer to that a specific feature, structure, material, or characteristic described in combination with an embodiment or an example are included in at least one embodiment or example of the present disclosure. In the present specification, the illustrative expressions of the above terms do not necessarily refer to a same embodiment or example. Furthermore, specific feature, structure, material or characteristic described above may be combined in a proper way in any one or more embodiments or examples. In addition, a person skilled in the art may combine different embodiments or examples described in the present specification, as well as features of the different embodiments or examples, without mutual contradiction.

Although the embodiments of the present disclosure have been shown and described above, it can be understood that the above embodiments are exemplary and cannot be understood as limitations to the present disclosure. Ordinary technical person in the art may make changes, modifications, substitutions, and variations to the above embodiments in the scope of the present disclosure.

The invention claimed is:

1. A display panel, wherein the display panel has a display region comprising a first display region and a second display region, and a density of pixel circuits in the first display region is less than a density of pixel circuits in the second display region; the display panel comprises:
   a base substrate;
   a plurality of first pixel circuits disposed on a side of the base substrate and disposed in the second display region;
   traces disposed on a side of the first pixel circuits away from the base substrate;
   first light emitting devices disposed on a side of the traces away from the base substrate and disposed in the first display region, wherein in a direction away from the base substrate, light emitting anode regions of first anodes in the first light emitting devices each comprise at least two conductive layers, and the at least two conductive layers comprise a first transparent electrode;
   connecting lines each disposed in a same layer as first transparent electrodes and electrically connected with a respective one of the first transparent electrodes;
   wherein, the traces electrically connect the respective first pixel circuits and the respective connecting lines, so that the first pixel circuits drive the first light emitting devices to emit light;
   wherein the traces are electrically connected with the connecting lines through first via holes, and the first via holes are located in the first display region; and
   wherein an orthographic projection of each of the first anodes on the base substrate and an orthographic projection of a corresponding trace among the traces electrically connected with the first anode on the base substrate do not overlap.

2. The display panel according to claim 1, wherein in the direction away from the base substrate, the first anodes each comprise the first transparent electrode, a silver electrode, and a second transparent electrode that are sequentially stacked, and the connecting lines each are integrally formed with the respective one of the first transparent electrodes.

3. The display panel according to claim 1, wherein the display panel further comprises:
   a first insulating layer disposed on the side of the first pixel circuits away from the base substrate, and having second via holes penetrating the first insulating layer, wherein the traces are located on a side of the first insulating layer away from the base substrate, and the traces are electrically connected with the respective first pixel circuits through the respective second via holes;
   a second insulating layer disposed on the side of the first insulating layer away from the base substrate, covering the traces, and having the first via holes penetrating the second insulating layer, wherein the connecting lines are disposed on a side of the second insulating layer away from the base substrate.

4. The display panel according to claim 1, wherein the first via holes are arranged in rows, and the traces are located between rows of the first via holes.

5. The display panel according to claim 1, wherein the first anodes each comprise light emitting anode region and a non-light emitting anode region surrounding the light emitting anode region, an area of an orthographic projection of the light emitting anode region on the base substrate is greater than or equal to an area of an orthographic projection of an opening defined by a pixel defining layer in the first light emitting devices on the base substrate, and the non-light emitting anode region is covered by the pixel defining layer, wherein the non-light emitting anode region only comprises the first transparent electrode.

6. The display panel according to claim 1, wherein the display region further comprises an under-screen functional region, which overlaps with the first display region.

7. The display panel according to claim 1, wherein the display panel further comprises:
   a plurality of second pixel circuits and a plurality of second light emitting devices that are both located in the second display region, wherein
   the second pixel circuits are electrically connected with the respective second anodes in the second light emitting devices directly through third via holes, to drive the second light emitting devices to emit light; or the display panel further comprises a conductive layer, which is disposed in a same layer as the traces, the second anodes are electrically connected with the conductive layer through fourth via holes that penetrate a second insulating layer, and the conductive layer is electrically connected with the second pixel circuits through fifth via holes that penetrate a first insulating layer, to drive the second light emitting devices to emit light.

8. A method for manufacturing the display panel according to claim 1, wherein the method comprises:
   forming the plurality of first pixel circuits on a side of the base substrate, and the first pixel circuits being located in the second display region;
   forming the traces on the side of the first pixel circuits away from the base substrate, and the traces being electrically connected with the respective first pixel circuits;
   forming first light emitting devices and connecting lines on a side of the traces away from the base substrate, wherein the first light emitting devices are located in the first display region, in the direction away from the base substrate, the light emitting anode regions of the first anodes in the first light emitting devices each comprise at least two conductive layers, at least one of the at least two conductive layers comprises a first transparent electrode, and the connecting lines each are electrically connected with the respective first transparent electrodes and formed through a same step as the first transparent electrodes,
   wherein, the traces electrically connect with the respective connecting lines, so that the first pixel circuits drive the first light emitting devices to emit light;
   wherein the traces are electrically connected with the connecting lines through first via holes, and the first via holes are located in the first display region; and
   wherein an orthographic projection of each of the first anodes on the base substrate and an orthographic projection of a corresponding trace among the traces electrically connected with the first anode on the base substrate do not overlap.

9. The method according to claim 8, wherein the method further comprises:
   depositing a first insulating material layer on the side of the first pixel circuits away from the base substrate, and forming second via holes that penetrate the first insulating material layer in the first insulating material layer, to form a first insulating layer having the second via holes;
   depositing a second insulating material layer on the side of the first insulating layer away from the base substrate, and forming first via holes that penetrate the second insulating material layer in the second insulating material layer, to form a second insulating layer having the first via holes;
   wherein, the traces are located between the first insulating layer and the second insulating layer, and are electrically connected with the respective first pixel circuits through the second via holes; the connecting lines are disposed on a side of the second insulating layer away from the base substrate, and are electrically connected with the respective traces through the respective first via holes.

10. The method according to claim 9, wherein steps of forming the first anodes and the connecting lines comprises:
   sequentially forming a first transparent conductive layer, a silver layer, and a second transparent conductive layer on a surface of the second insulating layer away from the base substrate by deposition;
   coating a first photoresist and a second photoresist in a first region and a second region that are on a surface of the second transparent conductive layer, respectively, and a thickness of the first photoresist is greater than a thickness of the second photoresist;
   removing the first transparent conductive layer, the silver layer, and the second transparent conductive layer that are not covered by the first photoresist and the second photoresist;
   ashing the first photoresist and the second photoresist to remove the second photoresist and thin the first photoresist;
   by an etching process, removing the second transparent conductive layer and the silver layer in the second region, and retaining the first transparent conductive layer to obtain the connecting lines;
   removing a thinned first photoresist to obtain the first anodes.

11. A display apparatus, wherein the display apparatus comprises:
   the display panel according to claim 1, wherein
   an under-screen functional layer, wherein an orthographic projection of the under-screen functional layer on the display panel overlaps the first display region.

12. The display panel according to claim 3, wherein the first via holes are arranged in rows, and the traces are located between rows of the first via holes.

13. The display panel according to claim 2, wherein the display region further comprises an under-screen functional region, which overlaps with the first display region.

14. The display panel according to claim 3, wherein the display region further comprises an under-screen functional region, which overlaps with the first display region.

15. The display panel according to claim 2, wherein the display panel further comprises:
   a plurality of second pixel circuits and a plurality of second light emitting devices that are located in the second display region, wherein
   the second pixel circuits are electrically connected with the respective second anodes in the second light emitting devices directly through third via holes, to drive the second light emitting devices to emit light; or
   the display panel further comprises a conductive layer, which is disposed in a same layer as the traces, the second anodes are electrically connected with the conductive layer through fourth via holes that penetrate a second insulating layer, and the conductive layer is electrically connected with the second pixel circuits through fifth via holes that penetrate a first insulating layer, to drive the second light emitting devices to emit light.

16. The display panel according to claim 3, wherein the display panel further comprises:
   a plurality of second pixel circuits and a plurality of second light emitting devices that are located in the second display region, wherein
   the second pixel circuits are electrically connected with the respective second anodes in the second light emitting devices directly through third via holes, to drive the second light emitting devices to emit light; or
   the display panel further comprises a conductive layer, which is disposed in a same layer as the traces, the second anodes are electrically connected with the conductive layer through fourth via holes that penetrate a second insulating layer, and the conductive layer is electrically connected with the second pixel circuits through fifth via holes that penetrate a first insulating layer, to drive the second light emitting devices to emit light.

\* \* \* \* \*